United States Patent
Wieczorek et al.

(10) Patent No.: US 9,110,174 B2
(45) Date of Patent: Aug. 18, 2015

(54) PIXELLATED DETECTOR DEVICE

(75) Inventors: Herfried Karl Wieczorek, Aachen (DE); Andreas Thon, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 32 days.

(21) Appl. No.: 13/817,151

(22) PCT Filed: Aug. 18, 2011

(86) PCT No.: PCT/IB2011/053644
§ 371 (c)(1),
(2), (4) Date: Feb. 15, 2013

(87) PCT Pub. No.: WO2012/025858
PCT Pub. Date: Mar. 1, 2012

(65) Prior Publication Data
US 2013/0153776 A1    Jun. 20, 2013

(30) Foreign Application Priority Data
Aug. 26, 2010   (EP) ..................................... 10305917

(51) Int. Cl.
*G01T 1/20* (2006.01)
*G01T 1/24* (2006.01)
*H01L 31/18* (2006.01)
*G01T 1/208* (2006.01)
*H01L 27/146* (2006.01)

(52) U.S. Cl.
CPC ............... *G01T 1/2006* (2013.01); *G01T 1/208* (2013.01); *G01T 1/2018* (2013.01); *G01T 1/249* (2013.01); *H01L 27/14663* (2013.01); *H01L 31/18* (2013.01)

(58) Field of Classification Search
CPC ... G01T 1/2018; G01T 1/1615; G01T 1/1648; G01T 1/202; G01T 1/2006; G01T 1/208; G01T 1/249; G01T 1/2985; H01L 27/14663; H01L 31/18
USPC ......................................................... 250/366
See application file for complete search history.

(56) References Cited

U.S. PATENT DOCUMENTS 4,743,764 A * 5/1988 Casey et al. ............... 250/363.03
4,749,863 A * 6/1988 Casey et al. ............... 250/363.03
(Continued)

FOREIGN PATENT DOCUMENTS

JP     62071882 A    4/1987
JP     02201288 A    8/1990
(Continued)

*Primary Examiner* — David J Makiya
*Assistant Examiner* — Taeho Jo

(57) ABSTRACT

A pixellated detector with an enhanced structure enables easy pixel identification even with high light output at crystal edges. A half-pixel shift between scintillator crystals (50) and detector pixels (12) enables the identification of a crystal (50) from four detector pixels (12) instead of nine pixels in case of optical crosstalk. Glass plates without any mechanical structuring may be used as a common substrate (60) for detectors and scintillators.

16 Claims, 3 Drawing Sheets

(56) References Cited

U.S. PATENT DOCUMENTS

| | | | |
|---|---|---|---|
| 5,319,204 A | 6/1994 | Wong | |
| 7,378,659 B2* | 5/2008 | Burr et al. | 250/362 |
| 8,294,108 B2* | 10/2012 | Tonami et al. | 250/363.02 |
| 2002/0121604 A1* | 9/2002 | Katagiri | 250/368 |
| 2006/0197022 A1* | 9/2006 | Burr et al. | 250/362 |
| 2006/0197025 A1* | 9/2006 | Burr et al. | 250/366 |
| 2008/0093559 A1* | 4/2008 | Dorscheid et al. | 250/366 |
| 2009/0236534 A1 | 9/2009 | Selfe et al. | |
| 2009/0261256 A1* | 10/2009 | Wieczorek | 250/363.05 |
| 2010/0038546 A1* | 2/2010 | Schulz | 250/362 |
| 2010/0098311 A1* | 4/2010 | Thon et al. | 382/131 |
| 2010/0200763 A1* | 8/2010 | Thon et al. | 250/370.11 |
| 2010/0219345 A1* | 9/2010 | Franch et al. | 250/362 |

FOREIGN PATENT DOCUMENTS

| | | | |
|---|---|---|---|
| JP | 2002207080 A | 7/2002 | |
| JP | 2003255049 A | 9/2003 | |
| JP | 2005017044 A | 1/2005 | |
| JP | 2007298313 A | 11/2007 | |
| WO | 2004049001 A1 | 6/2004 | |
| WO | 2005072612 A1 | 8/2005 | |
| WO | 2008107808 A2 | 9/2008 | |
| WO | WO 2008142590 A2 * | 11/2008 | G01T 1/164 |

* cited by examiner

FIG. 1
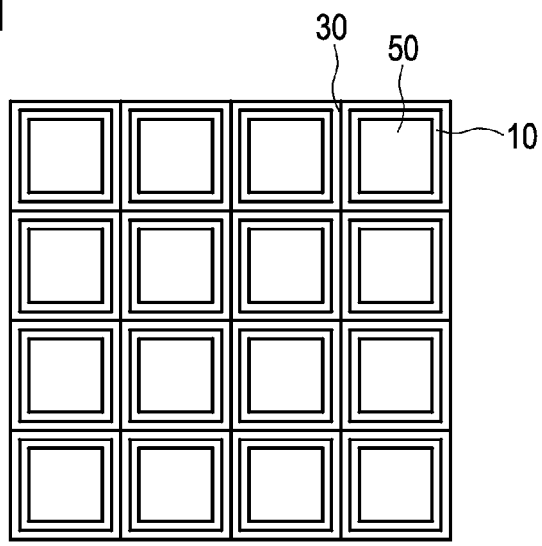
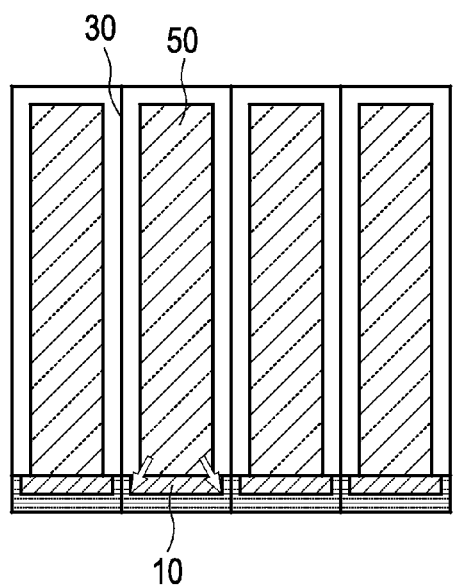
FIG. 2A
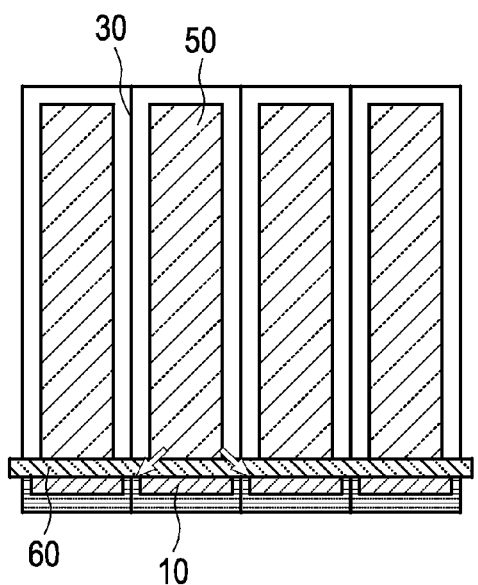
FIG. 2B

PIXELLATED DETECTOR DEVICE

FIELD OF THE INVENTION

The present invention relates to a pixellated detector device for use in nuclear imaging, such as positron emission tomography (PET). More specifically, the present invention relates to a pixellated detector in which an array of scintillator material is coupled to an array of photodetectors, such as in PET or in single photon emission computed tomography (SPECT).

BACKGROUND OF THE INVENTION

In past nuclear imaging devices, gamma radiation detectors employ scintillators that convert incident gamma radiation into light, which is then detected by photomultiplier tubes (PMTs). A scintillator is a material which exhibits scintillation - the property of luminescence when excited by ionizing radiation. Due to several drawbacks of photomultiplier tubes, there is interest in replacing them with solid state light sensors, such as avalanche photodiodes driven in Geiger mode, called e.g., silicon photomultipliers (SiPMs). Typical SiPMs have better timing and energy resolution than typical PMTs. A timing resolution significantly better than one nanosecond is becoming more valuable as time-of-flight PET (TOF-PET) scanners are becoming more prevalent, however, there have been serious impediments to adopting this new technology.

A pixellated detector is composed of a high resistivity semiconductor chip containing pixellated photodiodes with their respective readout electronics. This semiconductor chip is also called diode detection layer. For high sensitivity, the ratio of the diode area to the full area per pixel, called fill factor, should be high, typically above 50%. X-rays are absorbed in scintillator crystals that are on top of and optically coupled to the diode detection layer. The optical photons generated in the scintillator crystals are detected by the diodes of the respective individual pixels in the diode detection layer and converted into electrical signals. The signal of each pixel diode is read out by a specific read-out electronics channel on the semiconductor chip.

A gamma camera, also called a scintillation camera or Anger camera, is a device used to image gamma radiation emitting radioisotopes, a technique known as scintigraphy. The applications of scintigraphy include early drug development and nuclear medical imaging to view and analyse images of the human body or the distribution of medically injected, inhaled, or ingested radionuclides emitting gamma rays. Current SPECT detectors and early PET detectors have been built based on such an Anger camera with a continuous NaI:Tl crystal. Modern PET detectors use either a block detector, or arrays of individual scintillator crystals which are optically separated from each other with a reflective material. A suitable scintillator for TOF-PET is LYSO ($Lu_{1.8}Y_{0.2}SiO_5$:Ce), a suitable reflection layer can be obtained by wrapping the crystals in a layer of Teflon. Such an array is optically coupled to an array of PMTs, using an intermediate 'light guide' layer to spread the light generated by a gamma quantum in an individual scintillator crystal over the PMT array so that it is possible to use Anger logic.

Newer generations of PET detectors use much smaller detector pixels implemented as silicon photomultipliers (SiPM). The concept has generally been based on one-to-one coupling of scintillator crystal and SiPM. The idea is to measure the light generated within one scintillator pixels with only one SiPM detector, in order to maximize the signal on this detector, and to minimize the data readout rate and the influence of detector dark counts on the signal. Dark counts are an inherent property of SiPM technology. Accounting for even low optical crosstalk to neighboring pixels or for Compton scatter, at least nine detector pixels would have to be read out, the 'direct' detector pixel plus its eight neighbors. This larger readout area would require a nine-fold readout rate, and would mean a significantly larger contribution of dark counts to the signal. A promising concept for reflectors in scintillator arrays is the use of reflective sheets, e.g. Vikuiti Enhanced Specular Reflectors (Vikuiti ESR). These dielectric mirrors provide high reflectivity, very low optical crosstalk and no optical absorption, and they enable a high fill factor due to their thickness of only 65 μm. A part of the scintillation light is however channeled in the gap between crystal and reflector, yielding a higher light output right along the edges of the pixel. This increased light output from the interface just between crystal and reflector can have the result that, in spite of the small interface area, the scintillation light from this area contributes about 10-20% of the total signal. In a typical one-to-one coupling, however, the sensitive area of each detector pixel is centered below one scintillator crystal, while the non-sensitive areas of the chip (readout electronics etc.) are placed below the 'gaps' between the crystals which means that such a detector exactly misses most of the area of the crystal where the highest light output occurs. In addition, light from these 'gaps' can instead reach neighboring detector pixels, thereby increasing the undesirable light crosstalk.

FIG. 1 shows a schematic top view of a conventional pixellated detector device with an arrangement of scintillator crystals 50 with reflector cover 30 in one-to-one correspondence to detector pixels 10 with active photosensitive area.

FIGS. 2A and 2B show cross-sections of the conventional pixellated detector devices as shown in FIG. 1 without (FIG. 2A) and with a common glass substrate 60 (FIG. 2B). The arrows show light emitted from edge regions of scintillator pixels. Crosstalk would be high and part of the light would be lost with the common glass substrate 60 between crystals 50 and detector pixels 10 (FIG. 2B), even if the reflector sheets should be 100% reflective. Structuring the glass plate might be a solution but is risky and expensive.

Consequently, in the above conventional technical approach based on a one-to-one coupling of scintillator pixels and detector pixels (e.g. SiPM pixels) signal is lost, and it is extremely difficult to avoid optical crosstalk between pixels.

SUMMARY OF THE INVENTION

It is an object of the present invention to provide a pixellated detector device with reduced optical crosstalk between pixels, and with higher light collection efficiency.

Accordingly, the conventional one-to-one coupling approach is no longer used and a technologically easier solution is suggested. The proposed arrangement uses a substantial half-pixel shift between crystals and detector pixels in at least one dimension so that every scintillator crystal is read out by at least two detector pixels simultaneously.

Additionally, the specification for optical mounting is strongly relaxed in comparison to the conventional one-to-one correspondence, resulting in higher yield and reduced production costs.

According to a first aspect, the detector pixels and the scintillator crystals may be of same size and shifted with respect to each other by substantially half of their size in both dimensions. Thereby, every scintillator crystal is read out by four detector pixels simultaneously. The enhanced optical light output near the detector edges can thus be fully detected and does not lead to crosstalk into a neighboring detector pixel since this part of the signal is read out anyway. The emitting crystal is easily identified, without loss in energy resolution. Moreover, the dark count rate is from four pixels only. With a one-to-one correspondence it would practically be from nine pixels. If there should be crosstalk through the dielectric sheets into the four next neighbor crystals, its effect would be reduced since half the signal from those four pixels is counted for the crystal identified.

According to a second aspect which can be combined with the above first aspect, a common substrate may be used for both the detector array and the crystal array.

With the proposed detector arrangement, the common substrate is no longer detrimental, since crosstalk is no longer an issue.

According to a third aspect which can be combined with any one of the above first and second aspects, the detector pixels may be arranged at a pitch which is different from the pitch of the scintillator crystals. With the proposed detector arrangement, it is no longer necessary to use exactly the same pitch for crystals and detector pixels. This enables a constant pitch and exact arrangement of scintillator crystals, necessary for image reconstruction, and a slightly different pitch for detector pixels so that detector tiles can easily be arranged into larger modules without mechanical problems. The resulting space between tiles might even be used for data readout when a reflective layer is applied below the respective regions of the glass plate.

According to a fourth aspect which can be combined with any one of the above first and third aspects, two neighboring ones of the detector pixels may be merged so as to form a brick structure of the detector array. This enables crystal identification from only three detector pixels with doubled pixel area and the data read-out rate can be increased.

According to a fifth aspect which can be combined with the above second or third aspect, the detector pixels may be four times larger than the scintillator crystals (50), and wherein one scintillator crystal is centered above one detector pixel. Thereby, improved read-out rates can be achieved.

According to a sixth aspect which can be combined with any one of the above first and fifth aspects, detector pixels at the edges of the detector array may be halved in size. This enables a closer geometric correspondence of the scintillator and detector arrays.

According to a seventh aspect which can be combined with any one of the above first and sixth aspects, a reflector may be provided between the detector pixels to thereby account for optical losses in the detector gaps.

These and other aspects of the invention will be apparent from and elucidated with reference to the embodiments described hereinafter.

BRIEF DESCRIPTION OF THE DRAWINGS

In the following drawings:

FIG. 1 shows a schematic top view of a conventional pixellated detector device;

FIGS. 2A and 2B show cross-sections of the conventional pixellated detector devices as without and with common glass substrate;

DETAILED DESCRIPTION OF EMBODIMENTS

In the following embodiments, enhancement of a pixellated detector device by leaving the one-to-one coupling approach is explained. The embodiments are directed to PET and SPECT detectors built based on pixellated photo detectors, which may use solid state SiPM technology.

According to the embodiments, the proposed detector arrangement uses a half-pixel shift between crystals and detector pixels in both dimensions, so that every scintillator pixel can be read out by four detector pixels simultaneously This allows easy pixel identification from four neighboring detector pixels and keeps the dark count rate low, even if moderate optical crosstalk between neighbors should be present. Such a solution is possible with single photon counting as in PET and SPECT. The proposed structure enables easy pixel identification, and exploits the high light output at the crystal edges.

Figure 3:
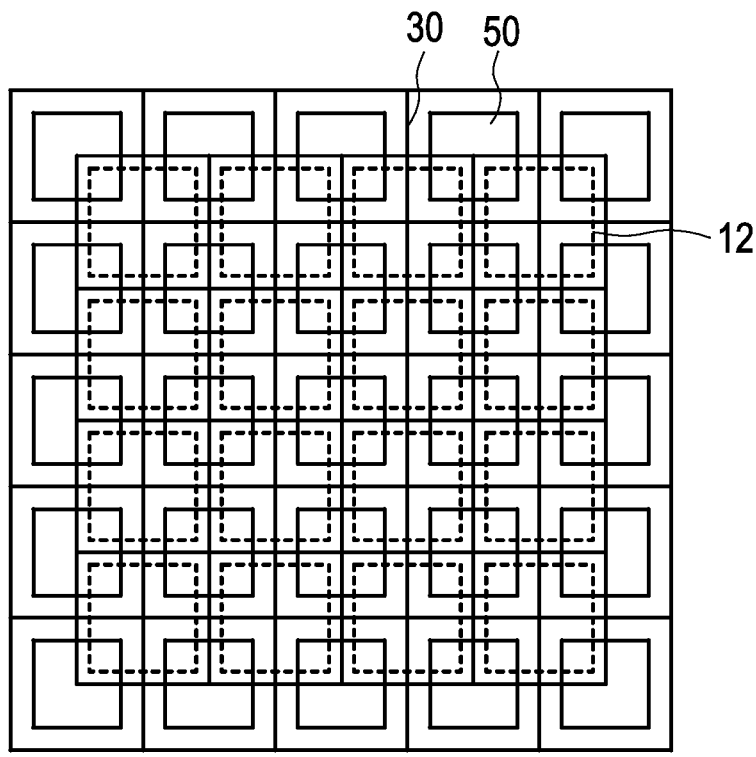
FIG. 3 shows a top view of a pixellated detector device according to a first embodiment.

FIG. 3 shows a top view of a pixellated detector device according to a first embodiment. A half-pixel shift is introduced between scintillator crystals 50 (with their reflective layer 30) and detector pixels 12 and enables the identification of a scintillator crystal 50 from four detector pixels 12 instead of nine pixels in case of optical crosstalk. Glass plates without any mechanical structuring may be used as a common substrate 60 (not shown in FIG. 3) for detector pixels 12 with the photosensitive areas 12 of the detector array and scintillator crystals 50 of the crystal array. Mounting accuracy and costs are strongly reduced. Even a different pixel and crystal pitch can be used, enabling an exact crystal pitch with tiled detectors.

Figure 4:
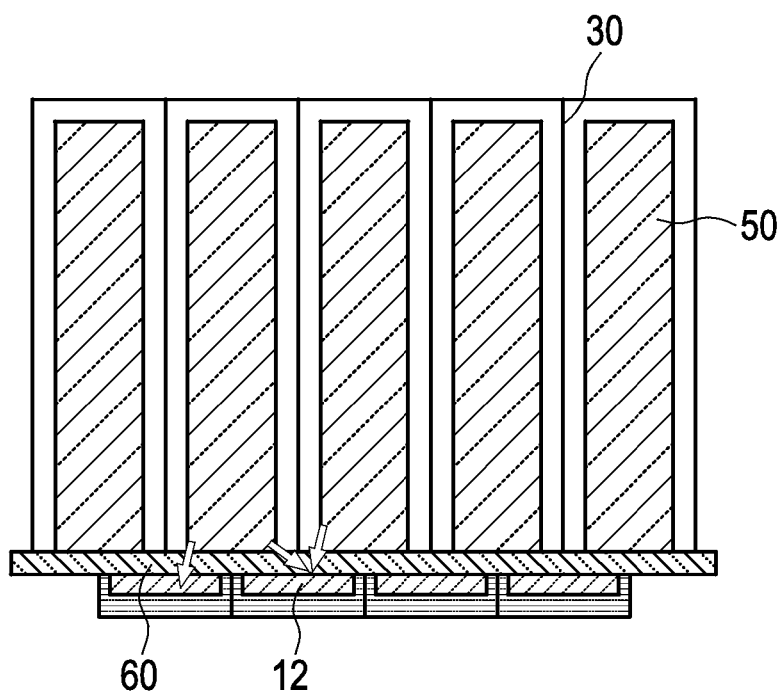
FIG. 4 shows a cross-section of the pixellated detector device according to the first embodiment.

FIG. 4 shows a cross-section of the pixellated detector device according to the first embodiment with the common substrate 60 and the reflective layer 30. As indicated by the arrows in FIG. 4, light emitted at crystal edges of two neighboring scintillator crystals 50 is detected in the same detector pixel 12.

The enhanced optical light output near the detector edges is thus fully detected and does not lead to crosstalk into a neighboring detector pixel since this part of the signal is read out anyway. The emitting crystal is easily identified, without loss in energy resolution. If there should be any crosstalk through the dielectric sheets into the four next neighbor crystals, its effect would be reduced since half the signal from those four detector pixels is counted for the scintillate crystal identified. Moreover, the dark count rate is from four pixels only. With a conventional one-to-one correspondence it would practically be from nine pixels.

As already mentioned above, a thin unstructured glass plate can be used as a common substrate 60 for the scintillator crystals 50 and the detector pixels 12. Optical crosstalk is no longer an issue.

In addition, the specification for optical mounting can be strongly relaxed in comparison to one-to-one correspondence, resulting in higher yield and reduced production costs. It is not necessary to use exactly the same pitch for scintillator crystals 50 and detector pixels 12. This enables a constant pitch and exact arrangement of scintillator crystals 50, necessary for image reconstruction, and a slightly different pitch for detector pixels 12 so that detector tiles can easily be arranged into larger modules without mechanical problems. The resulting space between tiles might even be used for data readout when a reflective layer is applied below the respective regions of the glass plate.

In the above first embodiment, each detector pixel 12 is exactly centered below four scintillator crystals 50.

Figure 5:
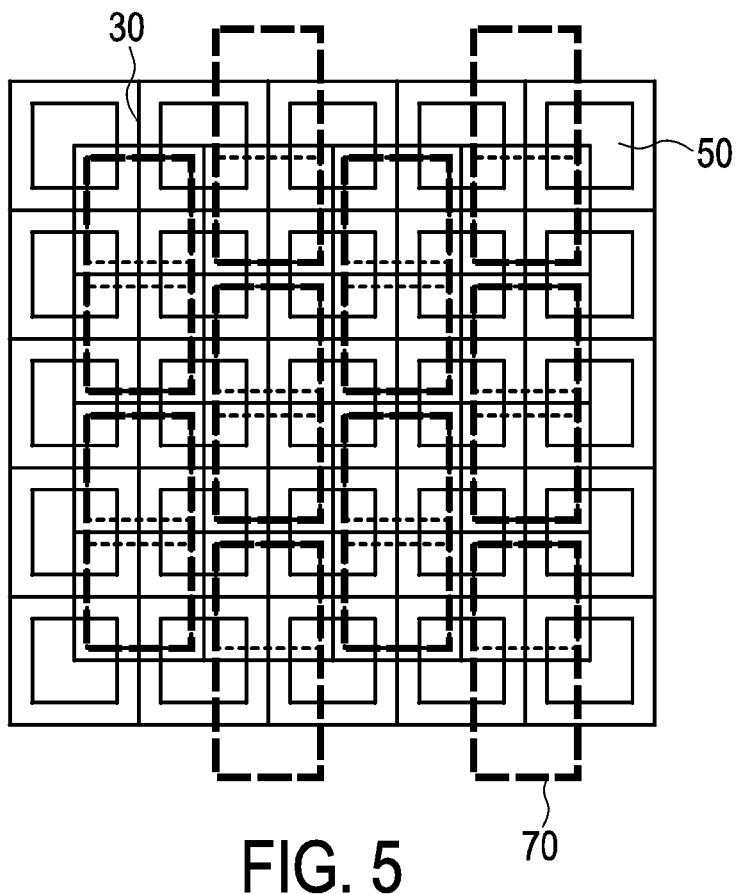
FIG. 5 shows a top view of a pixellated detector device with a brick-type pixel structure according to a second embodiment.

FIG. 5 shows a top view of a pixellated detector device according to a second embodiment with a brick-type pixel structure, a reflective layer 30 and scintillator crystals 50. This modification provides a sort of brick structure where two neighboring detector pixels 70 are merged, either by chip design or by software binning This enables crystal identification from only three detector pixels with doubled pixel area. The dark count rate will be increased by 50% but the data readout rate from the detector array (e.g. SiPM chip) will be halved. In view of the maximum readout rates from a complete PET system this might be a cost saving solution.

Figure 6:
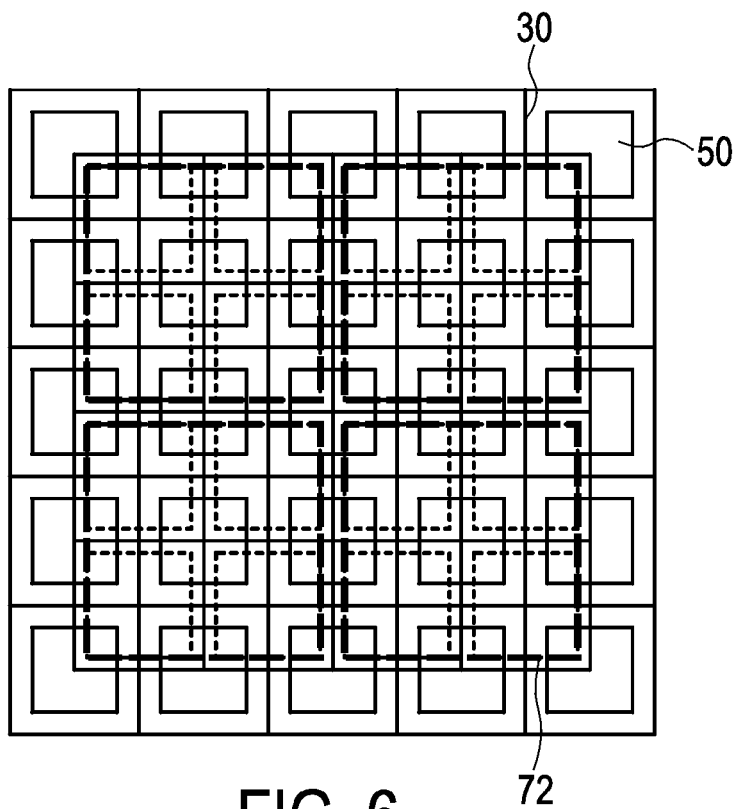
FIG. 6 shows a top view of a pixellated detector device with a larger pixel area according to a third embodiment.

FIG. 6 shows a top view of a pixellated detector device according to a third embodiment with a larger pixel area, a reflective layer 30 and scintillator crystals 50. This modification uses four times larger detector pixels 72 than the first embodiment, with one scintillator crystal 50 centered above the detector pixel 72 and neighboring crystals centered above two or four pixels. Crystal identification can be done by differentiation in the light spread between one, two or four detector pixels. This is an option for use with detectors that have a low enough dark count rate. Compared to the first embodiment the dark count rate is up to four times higher but the overall data readout rate is four times lower.

Detector pixels at the edges of a detector array may either be halved in size, enabling a close geometric correspondence of scintillator array and detector array, or the pixel size may be kept constant. With the option to use a slightly different pixel pitch on detector and crystal array this allows to place one column and row of crystals above the respective detector edges, without aligning problems of the detector tiles. Optical losses in the detector gap may easily be accounted for by a reflector positioned between the detector tiles. A gain correction for all detector pixels may be performed to account for mechanical misalignment.

The above pixellated detector devices according to the first to third embodiments can thus be manufactured by arranging a plurality of detector pixels in a detector array, arranging a plurality of scintillator crystals in a crystal array in geometric correspondence with the detector array, and shifting the detector pixels and the scintillator crystals with respect to each other by substantially half the size of the scintillator crystals in one or two dimensions.

It is noted that the present invention is not restricted to the above embodiments. Rather, the spatial shift between the scintillator crystals may be less than exactly half the pixel or crystal size and/or may be done in only one array dimension. This may provide suboptimal solutions, but would still enhance overall performance. The arrangements of the proposed first to third embodiments may be used in PET or SPECT cameras based on SiPM technology or other pixellated semiconductor detectors. In general, they may be used in any PET, SPECT, PET/CT (computed tomography), SPECT/CT, PET/MR (magnetic resonance), SPECT/MR systems.

In summary, a pixellated detector with an enhanced structure to enable easy pixel identification even with high light output at crystal edges has been described. A half-pixel shift between scintillator crystals and detector pixels enables the identification of a crystal from four detector pixels instead of nine pixels in case of optical crosstalk. Glass plates without any mechanical structuring may be used as a common substrate for detectors and scintillators.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single processor, sensing unit or other unit may fulfil the functions of several items recited in the claims. The mere fact that certain measures are recited in mutually different dependent claims does not indicate that a combination of these measures cannot be used to advantage.

Any reference signs in the claims should not be construed as limiting the scope thereof.

The present invention relates to a pixellated detector with an enhanced structure to enable easy pixel identification even with high light output at crystal edges. A half-pixel shift between scintillator crystals and detector pixels enables the identification of a crystal from four detector pixels instead of nine pixels in case of optical crosstalk. Glass plates without any mechanical structuring may be used as a common substrate for detectors and scintillators.

The invention claimed is:

1. A single photon counting pixellated detector device comprising:
   a detector array having a plurality of silicon photomultiplier (SiPM) detector pixels; and
   a crystal array having a plurality of scintillator crystals and arranged in geometric correspondence with the detector array;
   wherein said SiPM detector pixels and said scintillator crystals are shifted in at least one dimension with respect to each other by substantially half the size of the SiPM detector pixels; and
   wherein said detector pixels and said scintillator crystals are of same size and shifted with respect to each other by substantially half of their size in two dimensions.

2. The device according to claim 1, further including:
   light reflective material disposed between abutting faces of the scintillator crystals.

3. The device according to claim 2, further including:
   a glass substrate, one side of the glass substrate abutting the detector array and an opposite side of the glass substrate abutting the crystal array such that light from the crystal array passes through the glass substrate before striking the detector array.

4. The device according to claim 2, wherein a plurality of said detector pixels are merged to function as a single detector pixel .

5. A pixellated detector device a semiconductor chip which defines a square grid of detector pixels, each detector pixel including photodiodes and readout electronics;
   a crystal array including a square grid of scintillation crystals with a light reflective material between adjacent scintillation crystals;
   wherein said detector pixels and said scintillator crystals are of same size and shifted with respect to each other by substantially half of their size in two dimensions, such that centers of the scintillation crystals are disposed in geometric correspondence with adjoining corners of four abutting detector pixels, the scintillators each being optically coupled to four detector pixels.

6. The device according to claim 5, further comprising a common substrate used for both the detector array and the crystal array.

7. The device according to claim 5, wherein pairs of neighboring detector pixels are merged to function as single rectangular pixels.

8. The device according to claim 5, wherein the semiconductor chip further defines half-sized detector pixels adjacent edges of the semiconductor chip.

9. A pixellated detector device comprising:
a detector array having a plurality of detector pixels; and
a crystal array having a plurality of scintillator crystals and arranged in geometric correspondence with the detector array;
wherein said detector pixels and said scintillator crystals are shifted in at least one dimension with respect to each other by substantially half the size of the scintillator crystals;
wherein two neighboring ones of said detector pixels are merged to function as a single rectangular detector pixel so as to form a brick structure of said detector array.

10. The device according to claim 9, wherein the neighboring detector pixels are merged by chip design.

11. The device according to claim 9, further including a glass plate forming a common substrate for the detector pixels and the crystal array.

12. The device according to claim 9, further including half-sized detector pixels at edges of the detector array.

13. A pixellated detector device comprising:
a detector array having a plurality of detector pixels; and
a crystal array having a plurality of scintillator crystals and arranged in geometric correspondence with the detector array;
wherein said detector pixels and said scintillator crystals are shifted in at least one dimension with respect to each other by substantially half the size of the scintillator crystals;
wherein detector pixels at the edges of said detector array are halved in size.

14. The device according to claim 13, further comprising a reflector provided between said detector pixels.

15. A pixellated detector device comprising:
a detector array having a plurality of detector pixels; and
a crystal array having a plurality of scintillator crystals and arranged in geometric correspondence with the detector array;
wherein said detector pixels and said scintillator crystals are shifted in at least one dimension with respect to each other by substantially half the size of the scintillator crystals;
wherein two neighboring detector pixels are merged by software binning to function as a single rectangular detector pixel so as to form a brick structure of said detector array.

16. A single photon counting pixellated detector device comprising:
a detector array having a plurality of silicon photomultiplier (SiPM) detector pixels; and
a crystal array having a plurality of scintillator crystals and arranged in geometric correspondence with the detector array;
wherein said SiPM detector pixels and said scintillator crystals are shifted in at least one dimension with respect to each other by substantially half the size of the SiPM detector pixels;
wherein two or more neighboring detector pixels are merged by software binning to double or more a detector pixel area.

* * * * *